United States Patent [19]

Kubotera et al.

[11] 4,217,408
[45] Aug. 12, 1980

[54] PRINTING PLATE MATERIAL

[75] Inventors: Kikuo Kubotera; Eiichi Mizuki, both of Asaka; Hideo Kawano; Tadahiro Fujiwara, both of Minami-ashigara, all of Japan

[73] Assignee: Fuji Photo Film Co., Ltd., Kanagawa, Japan

[21] Appl. No.: 744,076

[22] Filed: Nov. 22, 1976

Related U.S. Application Data

[63] Continuation of Ser. No. 187,259, Oct. 7, 1971, abandoned.

[30] Foreign Application Priority Data

Oct. 7, 1970 [JP] Japan .................... 45-88136

[51] Int. Cl.$^2$ .................... G03C 1/78; G03F 7/06
[52] U.S. Cl. .................... 430/205; 430/227; 430/231; 430/232
[58] Field of Search .................... 96/29 L, 76, 87 R

[56] References Cited

U.S. PATENT DOCUMENTS

| | | | |
|---|---|---|---|
| 1,984,416 | 12/1934 | McNally et al. | 96/87 R |
| 2,014,547 | 9/1935 | Babcock | 96/87 R |
| 2,096,617 | 10/1937 | Nadeau | 96/87 R |
| 3,220,832 | 11/1965 | Uhlig | 96/87 R |
| 3,385,701 | 5/1968 | Ormsbee et al. | 96/29 L |
| 3,438,778 | 4/1969 | Uhlig | 96/87 R |
| 3,495,985 | 2/1970 | Keyser | 96/87 R |
| 3,511,656 | 5/1970 | Regan et al. | 96/29 L |

FOREIGN PATENT DOCUMENTS

1084070  6/1966  United Kingdom .

*Primary Examiner*—Roland E. Martin, Jr.
*Assistant Examiner*—John L. Goodrow
*Attorney, Agent, or Firm*—Sughrue, Rothwell, Mion, Zinn and Macpeak

[57] ABSTRACT

A printing plate having an improved durability which has a support having an oleophilic surface and a hydrophilic diffusion transfer image-receiving layer containing nucleus substance for the physical development and having between the oleophilic and hydrophilic layers at least one of gelatin or nitrocellulose.

28 Claims, 5 Drawing Figures

PRINTING PLATE MATERIAL

This is a continuation of application Ser. No. 187,259, filed Oct. 7, 1971, now abandoned.

BACKGROUND OF THE INVENTION

1. Field of the Invention

The present invention relates to a printing plate material and more particularly to one which provides a printing plate having an improved printing durability.

2. Description of the Prior Art

In general, a lithographic printing plate consists of the oleophilic ink-adhering portions for forming an image area and the hydrophilic portions for forming a non-image area. In the manufacture of such a printing plate, there is known a process in which only the image area of the hydrophilic surface is converted to become oleophilic and a process in which a hydrophilic layer is formed on the surface of the oleophilic substance and then only the hydrophilic layer of image area is removed to expose the oleophilic surface. As an example of a process belonging to the latter, a process is described in British Pat. No. 1,129,366, wherein a silver image is formed on the hydrophilic layer of the sensitive plate by diffusion transfer development, and the sensitive plate a hydrophilic layer containing the nucleus substance for the diffusion transfer process is formed on the support and has an oleophilic surface, a silver halide light-sensitive emulsion is coated thereon, and the hydrophilic layer for the corresponding area is removed through the etching-bleach treatment using the silver image to expose the oleophilic support resulting in a printing plate. Another process is described in U.S. Pat. No. 3,385,701, wherein an exposed negative material is contacted to a sheet and subjected to diffusion transfer development to form a silver image on the hydrophilic layer, the sheet containing a hydrophilic layer containing nucleus substance for the diffusion transfer process on a support having an oleophilic surface, and the hydrophilic layer for the corresponding area is removed through the etching-bleach treatment using the silver image to expose the oleophilic support resulting in a printing plate.

However, when these known printing plates are used in practice for printing, there is found a disadvantage in that the background becomes spotty due to a separation of the hydrophilic layer which is apt to take place and a good quantity of printed matter of good quality is difficult to obtain. For example, as to the printing plate disclosed in British Pat. No. 1,129,366, when the hydrophilic image-receiving layer is coated directly on the surface of oleophilic support, if the adhesion between the support surface and the hydrophilic layer is not sufficient, the hydrophilic layer of non-image area is apt to be separated on printing and the adhesion thereto of oily ink results in background spots.

For the common lithographic printing plate in which a hydrophilic layer is formed directly on the oleophilic surface, the hydrophilic layer corresponding to the image area is removed to expose the oleophilic surface, and there is a difference between the affinity to an oily ink of said oleophilic surface and the hydrophilic layer, in order to prevent the occurrence of background spots resulted from the adhesion of ink to the non-image area by making the difference in the affinity to ink as great as possible. This can be attained by making the hydrophilic property of said hydrophilic layer as high as possible. However, as a result, the adhesion between the oleophilic surface and the hydrophilic layer grows worse and the non-image area of the hydrophilic layer is itself separated to yield the background spots. It has been long desired by those skilled in the art to provide a printing plate free from the formation of background spots and also having a good printing durability by overcoming these problems.

OBJECTS OF THE INVENTION

Accordingly, an object of the present invention is to provide a printing plate material which gives a printing plate free from the background spots and has an improved printing durability. Another object of the present invention is to provide a process for making simply a printing plate free from the background spots and having a good printing durability by applying the diffusion transfer development process and the etching-bleach process. Other objects will be apparent to those skilled in the art as the description of this invention proceeds.

SUMMARY OF THE INVENTION

These objects have been accomplished by applying an organic solvent containing at least one of gelatin or nitrocellulose between the oleophilic support and the hydrophilic layer and removing the organic solvent to form an intermediate layer.

That is, this invention relates to a printing plate material which has a support having an oleophilic surface and a hydrophilic diffusion transfer image-receiving layer containing nucleus substance for the physical development, characterized in that an organic solvent containing at least one of gelatin or nitrocellulose is applied between the support and the image-receiving layer and the organic solvent is removed to form an intermediate layer.

DETAILED DESCRIPTION OF THE INVENTION

Figure 1:
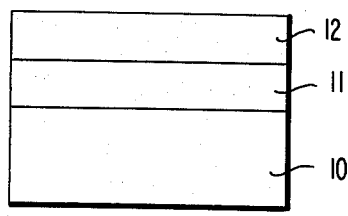
FIG. 1 is a sectional view showing one embodiment of printing plate material according to the present invention.

In one embodiment of the printing plate material according to this invention, as shown in FIG. 1, an intermediate layer 11 is formed on the support 10 having an oleophilic surface and a hydrophilic diffusion transfer image-receiving layer 12 containing nucleus substance for the physical development is formed atop the intermediate layer 11.

The intermediate layer according to this invention satisfies both the requirement under which it should adhere strongly to the hydrophilic surface of support as well as the hydrophilic image-receiving layer and the requirement under which the portion corresponding to the silver image formed on the hydrophilic image-receiving layer should be etched in the etching bleach treatment used in the formation of the printing plate. The intermediate layer according to this invention is formed by dissolving or dispersing gelatin or nitrocellulose in organic solvent, coating the solution on a support in a common manner and drying it to remove the organic solvent. Those gelatins and nitrocelluloses to be used here are those used generally in the photographic field. As examples of organic solvents there may be used those having the property that may dissolve or swell the surface of support. For example, there are acetone, methyl ethyl ketone, cyclohexanone, tetrahydrofuran, dioxane, methanol, ethanol, ethyl formate, methyl acetate, ethyl acetate, benzene, toluene, methylene chloride, ethylene chloride, tetrachloroethane, trichloroethane, chloroform, chlorobenzene, ethylene chlorohydrin, chlorosulfonic acid, nitromethane, dimethyl formamide, morpholine, formic acid, acetic acid, benzoic acid, salicylic acid, salicylic acid ester, monochloroacetic acid, dichloroacetic acid, trichloroacetic acid, trifluoroacetic acid, 2-nitropropanol, benzyl alcohol, benzaldehyde, acetonyl acetone, acetophenone, benzamide, benzonitrile, benzyl amine, methyl nicotinate, phenol, o-chlorophenol, cresol and other phenol derivatives. These solvents may be used either alone or as mixture of two or more of the solvents.

A suitable organic solvent can be properly selected depending on the nature of the support or image-receiving layer. Depending on the nature of the support placed on the intermediate layer and the composition, hardness and thickness of the image-receiving layer placed thereon, as well as the amount and form of silver formed on the image-receiving layer, an effective intermediate layer can be obtained by selectively adjusting the composition or thickness thereof. Since a thickness of said layer greater than that required is disadvantageous from the viewpoint of treatment or printability, the thickness is preferably in the range of about 0.1–2μ, and more preferably about 0.1–0.5μ.

As other elements of the printing plate materials according to this invention, i.e. support, image-receiving layer etc., those known in the art can be used. As examples of suitable supports there are films of resin such as polyethylene terephthalate, cellulose acetate etc., synthetic paper, resin-coated paper, metal plate etc. When a hydrophilic metal plate such as an aluminum plate is used, an oleophilic layer is formed by means of coating, evaporation, metal plating, spraying or laminating so that a printing ink may be provided on the surface of said metal plate. A polyethylene terephthalate film is excellent in the oleophilic property, dimensional stability and flexibility and is often used.

The image-receiving layer is formed by dispersing a substance, which forms nuclei for the physical development, in a medium to be etched by the action of the silver image through the etching-bleach treatment. As the medium, those which have been used in the art, e.g. gelatin, gum arabic, sodium alginate, methyl cellulose, carboxymethyl cellulose, hydroxymethyl cellulose, hydroxyethyl starch, hydroxypropyl starch, starch, polyvinylalcohol, polyvinylpyrrolidone, phenylpyrrolidone, vinylpyrrolidone-methmethacrylic acid copolymer or acrylic acid-methylmethacrylate copolymer, are suitable. The substance which forms nuclei is one which is used conventionally, e.g. colloidal silver, silver sulfide, nickel sulfide, zinc sulfide, sodium sulfide, colloidal sulfur, thiosinamine, stannous chloride, chloroauric acid etc.

For the formation of the printing plate from the printing plate material according to the present invention, any known process can be applied. A sensitive material having a negative latent image formed by photographing an original is placed in contact with the printing plate material according to the present invention in the diffusion transfer development process to form a positive silver image on the image-receiving layer of the printing plate material, which is then subjected to the etching-bleach treatment, and the hydrophilic layer and the intermediate layer at the silver image area are then removed to yield a printing plate. For photographing the original, a conventional silver halide sensitive material may be used. A sensitive material coated with a diffusion transfer emulsion or a lithographic emulsion is especially preferable. For the exposure, the contact print, enlarging, transmission or reflection may be employed. A known method may be applied to the diffusion transfer development. The etching-bleach treatment is also carried out by a known method.

Figure 2A:
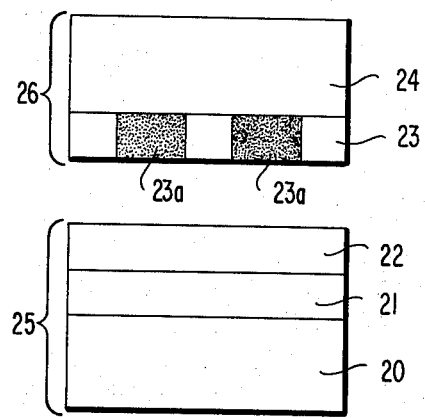
FIGS. 2a, 2b and 2c are sectional views showing the principal steps of the process for making a printing plate by using the printing plate material according to the present invention.

An embodiment for the formation of the printing plate is illustrated with reference to drawings. FIG. 2a shows the section views of printing plate material 25 according to this invention and of exposed sensitive material 26. The printing plate material 25 has the intermediate layer 21 on the support 20 having an oleophilic surface and the diffusion transfer image-receiving layer 22 containing a nucleus substance for the physical development thereon.

Figure 2B:
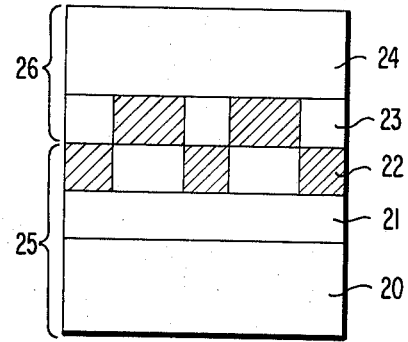
Figure 2C:
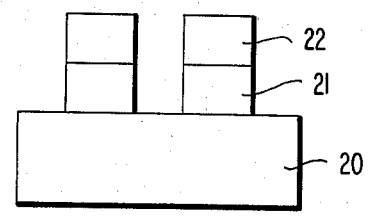

The sensitive material 26 has the sensitive silver halide emulsion layer 23 on the support 24 as paper or resin film and a latent image is formed previously at the portion 23a corresponding to the non-image area of the original by the exposure. FIG. 2b shows the development of the printing plate material 25 in contact with the sensitive material 26 in the presence of a diffusion transfer developer. At the exposed portion of emulsion layer 23, the silver halide is developed chemically to form a silver image, which is negative to the original. On the other hand, a silver image is formed at the portion corresponding to the image area of the original on the image-receiving layer 22. The image is positive to the original and formed by the fact that silver halide as a complex salt diffuses from the non-image area of emulsion layer 23 to the image-receiving layer 22 by means of the solvent for the silver halide contained in the developer and contacted to the nucleus substance for the physical development, there to be reduced into metallic silver. After the completion of development, the printing plate material is separated from the sensitive material and treated with a known etching-bleach solution after washing with water. The portion containing the silver image on the image-receiving layer is etched by the treatment, during which the portion corresponding to the silver image in the intermediate layer under the image-receiving layer is also subjected to the etching. The surface of said printing plate material is rubbed slightly by a cotton pad to remove the etched portion of said image-receiving layer and intermediate layer resulting in the exposure of the oleophilic surface of the support 20. On the other hand, the hydrophilic image-receiving layer corresponding to the non-image area of the image-receiving layer remains together with the intermediate layer, as is shown in the FIG. 2c. The thus formed printing plate provides a number of stable reproductions of high quality by using a commercial printing ink and wetting water.

In the above description, the printing plate material is separated from the sensitive material so that it is possible, if necessary, to combine the printing material with any sensitive material for the use. It is convenient to preserve and handle the printing plate material because of its non-sensitivity.

Additionally, it is economically advantageous and serves for the omission of labor to photograph an image from the original to a sensitive material and form a printing plate. Accordingly, this is attained as described in another embodiment of this invention, which is described hereinafter, in which the printing plate material is combined with a sensitive material.

That is, this invention provides also a printing plate material having a support having an oleophilic surface, a hydrophilic diffusion transfer image-receiving layer containing nucleus material for the physical development and a sensitive silver halide emulsion layer, wherein one of a solution of gelatin or nitrocellulose in an organic solvent is applied between the support and image-receiving layer and the organic solvent is removed to form an intermediate layer.

Figure 3:
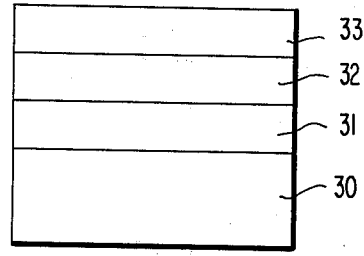
FIG. 3 is a sectional view showing another embodiment of the printing plate material according to the present invention.

In one embodiment of this printing plate material, as shown in FIG. 3, the intermediate layer 31 is formed on the support 30 having an oleophilic surface, the hydrophilic diffusion transfer image-receiving layer 32 containing nucleus material for the physical development is formed thereon and further the sensitive silver halide emulsion layer 33 is formed thereon. As said sensitive silver halide emulsion layer to be used here, any known material may be used and preferably those which are used are those in which the exposed silver salt is sufficiently developed rapidly during the diffusion transfer development process and, on the other hand, the exposed silver salt sufficiently forms rapidly a complex compound and is reduced quickly on the image-receiving layer. As examples of the silver halides, those used in general, such as silver chloride, silver bromide, silver iodide, silver chlorobromide, silver chloroiodide, silver bromoiodide, silver chlorobromoiodide, etc., may be utilized. Gelatin is used generally as the binder and other hydrophilic colloids may be used. If necessary, various kinds of sensitizers, sensitizing dyestuffs, antifogging agents, hardeners, surface active agents and other additives used in general may be added to the silver halide emulsion.

A conventional method may be utilized for the formation of the printing plate using the sensitive printing plate material according to this invention. The printing plate material exposed through an original is subjected to diffusion transfer development to form a negative silver image on the emulsion layer and a positive silver image on the image-receiving layer. The emulsion layer is washed off with water and the material is subjected to the etching-bleach treatment, whereby the portion of said image-receiving layer containing the silver image and the intermediate layer in contact thereto are etched and the portion is removed by rubbing with a cotton pad to expose the surface of support. The resulting printing plate can be used in a common manner.

The printing plate material according to this invention is characterized by providing with an intermediate layer between the oleophilic support and hydrophilic image-receiving layer but, if necessary, a further protective layer, stripping layer, anti-halation layer etc. may be provided.

EXAMPLE 1

A gelatin dispersion in an organic solvent having the following composition was coated on one surface of ultraviolet irradiated polyethyleneterephthalate film (180μ thick) and dried at 120° C. for 2 min. to form an intermediate layer of 0.2μ thickness.

| Gelatin | 1 g |
| --- | --- |
| Water | 1 g |
| Acetic acid | 1 g |
| Methanol | 20 g |
| Acetone | 60 g |
| Methylene chloride | 10 g |
| Tetrachloroethane | 5 g |
| Phenol | 5 g |

An aqueous gelatin solution containing a nucleus material for the physical development having the following composition was coated thereon and dried at 60° C. for 60 min. to form a hydrophilic diffusion transfer image-receiving layer 0.5μ thick resulting in a printing plate material.

| Nickel sulfide-gelatin dispersion (nickel sulfide 5 × 10−4%) (gelatin 0.5%) | 0.6 g |
| --- | --- |
| Gelatin | 0.6 g |
| Water | 100 g |
| 1% aq. Sodium dodecylbenzene-sulfonate | 0.1 g |
| 1% aq. Chromium acetate | 12 g |

The printing plate material was contacted with an image-exposed silver halide sensitive material at 25° C. for 30 sec. in the presence of liquid developer having the following composition to take place the diffusion transfer development.

| p-Methylaminophenol sulfate | | 5 g |
| --- | --- | --- |
| Anhydrous sodium sulfite | | 65 g |
| Hydroquinone | | 15 g |
| anhydrous sodium thiosulfate | | 15 g |
| Sodium hydroxide | | 20 g |
| Water | to make up | 1 liter |

The negative material was stripped, washed with water and dipped at 25° C., for 30 sec., in the etching solution which was an equal volume mixture of Liquids Ia and II having the following compositions:

| Liquid Ia: | | |
| --- | --- | --- |
| Cupric chloride (dihydrate) | | 10 g |
| Citric acid | | 10 g |
| Water | to make up | 1 liter |
| Liquid II: | | |
| 3% aq. hydrogen peroxide | | |

By the above treatment, the silver image formed on the image-receiving layer was bleached and at the same time was etched. In this case, the intermediate under the image portion was also etched simultaneously. When the surface was rubbed slightly with a cotton cloth, the etched portion was removed to reveal the oleophilic surface of the support. The resulting printing plate was applied to a common off-set printing machine and the printing was carried out with a commercial ink and wetting water to yield good printed matter of 5,000 sheets.

EXAMPLE 2

An anti-halation layer was formed on one surface of ultraviolet irradiated polyethylene terephthalate film (180μ thick), a mixed dispersion of gelatin-nitrocellulose having the following composition was coated on the other surface and dried at 100° C., for 10 min., to form an intermediate layer of 0.3μ thickness.

| | |
|---|---|
| Gelatin | 0.4 g |
| Nitrocellulose | 0.4 g |
| Water | 0.4 g |
| p-Chlorophenol | 3.0 g |
| Salicylic acid | 0.12 g |
| Methanol | 1.18 g |
| Ethylene chloride | 67.0 g |
| Acetone | 30.0 g |

An aqueous gelatin-gum arabic containing nucleus material for the physical development having the following composition was coated on the intermediate layer and dried at 60° C. for 60 min. to form a hydrophilic diffusion transfer image-receiving layer of 0.5μ thickness.

| | |
|---|---|
| Nickel sulfide-gelatin dispersion (same as in Example 1) | 0.6 g |
| Gelatin | 0.3 g |
| Gum arabic | 0.3 g |
| Water | 100 g |
| 1% aq. Sodium dodecylbenzenesulfonate | 0.4 g |
| 1% aq. Chromium acetate | 12 g |

A panchromatic unhardened gelatin-silver chlorobromide emulsion for lithography (70% silver chloride; containing one mol of silver per kg emulsion) was coated on the image-receiving layer so as to yield a dried film of 4μ thick. A 1% aqueous gelatin solution was further coated thereon to form a protective layer 1μ thick (dry).

The resulting sensitive printing plate material was exposed to a positive original and developed at 20° C. for 30 sec. with the liquid developer of Example 1. It was then washed with water at 30° C. to remove the emulsion layer and dipped in the etching-bleach solution, which is an equal volume mixture of Liquid I and II having the following compositions:

| | | |
|---|---|---|
| Liquid I: | | |
| Cupric chloride (dihydrate) | | 10 g |
| Citric acid | | 10 g |
| Water | to make up | 1 liter |
| Liquid II: | | |
| 3% aq. Hydrogen peroxide | | |

The surface was rubbed slightly with a cotton cloth to remove the etched portions of said image-receiving layer and said intermediate layer resulting in the appearance of the oleophilic surface of the support. 5,000 sheets of good reproductions of an original were obtained by using the resulting printing plate.

EXAMPLE 3

Excellent printed matter was obtained in the same manner as in Example 2 except for using as the intermediate layer a nitrocellulose solution of the following composition.

| | |
|---|---|
| Cellulose nitrate | 0.8 g |
| p-Chlorophenol | 3.0 g |
| Methanol | 1.18 g |

-continued

| | |
|---|---|
| Ethylene chloride | 67.0 g |
| Acetone | 30.0 g |

Controls are described as follows to illustrate further the characteristics of the printing plate material according to the present invention.

CONTROL 1

Without providing the intermediate layer according to the present invention, an ultraviolet irradiated polyethylene terephthalate film was coated directly with an aqueous gelatin solution containing nucleus material for the physical development and dried at 60° C. for 60 min. to form a hydrophilic diffusion transfer image-receiving layer resulting in a printing plate material. The printing plate material was developed in the same manner as in Example 1 after the exposure. On separating the negative material, the hydrophilic diffusion transfer image-receiving layer came free from the polyethylene terephthalate film and failed in printing.

CONTROL 2

A mixed solution of polyester-nitrocellulose having the following composition was coated on one surface of a ultraviolet irradiated polyethylene terephthalate film (180μ thick) and dried at 120° C. for 10 min. to form an intermediate layer of 0.2μ thickness.

| | |
|---|---|
| Polyester* | 0.7 g |
| Nitrocellulose | 1.0 g |
| Ethylene dichloride | 150.0 g |
| Acetone | 50.0 g |
| Methanol | 13.0 g |
| Tetrachloroethane | 15.0 g |

The aqueous gelatin solution containing nucleus material for the physical development of Example 1 was coated thereon and dried at 60° C. for 60 min. to form a hydrophilic diffusion transfer image-receiving layer of 0.5μ thick resulting in a printing plate material. The printing plate material was exposed and treated in the same manner as described in Example 1. The intermediate layer of the resulting printing plate was not etched perfectly so that printing ink did not attach to the image area thereof and it could not be used.

The outstanding effect of the intermediate layer according to the present invention will be readily understood by the above controls.

What is claimed is:

1. A printing plate material comprising (1) a support having an oleophilic surface, (2) an intermediate layer and (3) a hydrophilic diffusion transfer image-receiving layer containing nucleus substance for the physical development wherein the improvement comprises (A) that said intermediate layer consists essentially of gelatin, nitrocellulose or mixtures thereof, (B) that said intermediate layer adheres strongly to said oleophilic surface of said support and said hydrophilic diffusion transfer image-receiving layer, (C) that said intermediate layer is formed by coating a liquid consisting essentially of an organic solvent and gelatin, nitrocellulose or admixtures thereof on said oleophilic surface of said support and being removed said organic solvent, and (D) that the portion of said intermediate layer corresponding to the silver image formed on said hydrophilic diffusion transfer image-receiving layer by silver complex diffusion transfer development is etched in the etching bleach treatment simultaneously together with said silver image portion of said hydrophilic diffusion transfer image-receiving layer.

2. The printing plate material as claimed in claim 1 wherein said support having an oleophilic surface is selected from the group consisting of polyethylene terephthalate film, cellulose acetate film, synthetic paper, waterproofing paper and matal plates.

3. The printing plate material as claimed in claim 1 wherein said intermediate layer has an 0.1 to 2μ thickness.

4. The printing plate material as claimed in claim 1 wherein said nucleus substance for physical development is selected from the group consisting of colloidal silver, silver sulfide, nickel sulfide, zinc sulfide, colloidal sulfur, thiosinamine, stannous chloride and chloroauric acid.

5. The printing plate material as claimed in claim 1 wherein said hydrophilic diffusion transfer image-receiving layer is selected from the group consisting of gelatin, gum arabic, sodium alginate, methyl cellulose, carboxymethyl cellulose, hydroxymethyl cellulose, hydroxyethyl starch, hydroxypropyl starch, starch, polyvinylalcohol, polyvinylpyrrolidone, phenylpyrrolidone, vinylpyrrolidone-methacrylate acid copolymer and acrylic acid-methylmethacrylate copolymer.

6. The printing plate material as claimed in claim 1 wherein said organic solvent is selected from the group consisting of acetone, methyl ethyl ketone, cyclohexanone, tetrahydrofuran, dioxane, methanol, ethanol, ethyl formate, methyl acetate, ethyl acetate, benzene, toluene, methylene chloride, ethylene chloride, tetrachloroethane, trichloroethane, chloroform, chlorobenzene, ethylene chlorohydrin, chlorosulfonic acid, nitromethane, dimethyl formamide, morpholine, formic acid, acetic acid, benzoic acid, salicyclic acid, salicyclic acid ester, monochloroacetic acid, dichloroacetic acid, trichloroacetic acid, trifluoroacetic acid, 2-nitropropanol, benzyl alcohol, benzaldehyde, acetonyl acetone, acetophenone, benzamide, benzonitrile, benzyl amine, methyl nicotinate, phenol, o-chlorophenol, cresol and other phenol derivatives.

7. A printing plate material comprising (1) a support having an oleophilic surface, (2) an intermediate layer, (3) a hydrophilic diffusion transfer image-receiving layer containing nucleus substance for the physical development and (4) a photosensitive silver halide emulsion layer wherein the improvement comprises (A) that said intermediate layer consists essentially of gelatin, nitrocellulose or mixtures thereof, (B) that said intermediate layer adheres strongly to said oleophilic surface of said support and said hydrophilic diffusion transfer image-receiving layer, (C) that said intermediate layer is formed by coating a liquid consisting essentially of an organic solvent and gelatin, nitrocellulose or mixtures thereof on said oleophilic surface of said support and being removed said organic solvent, and (D) that the portion of said intermediate layer corresponding to the silver image formed on said hydrophilic diffusion transfer image-receiving layer by silver complex diffusion transfer development is etched in the etching bleach treatment simultaneously together with said silver image portion of said hydrophilic diffusion transfer image-receiving layer.

8. The printing plate material as claimed in claim 7 wherein said support having an oleophilic surface is selected from the group consisting of polyethylene terephthalate film, cellulose acetate film, synthetic paper, waterproofing paper and metal plates.

9. The printing plate material as claimed in claim 7 wherein said intermediate layer has an 0.1 to 2μ thickness.

10. The printing plate material as claimed in claim 7 wherein said nucleus substance for physical development is selected from the group consisting of colloidal silver, silver sulfide, nickel sulfide, zinc sulfide, colloidal sulfur, thiosinamine, stannous chloride and chloroauric acid.

11. The printing plate material as claimed in claim 7 wherein said hydrophilic diffusion transfer image-receiving layer contains a member selected from the group consisting of gelatin, gum arabic, sodium alginate, methyl cellulose, carboxymethyl cellulose, hydroxymethyl cellulose, hydroxyethyl starch, hydroxypropyl starch, starch, polyvinylalcohol, polyvinylpyrrolidone, phenylpyrrolidone, vinylpyrrolidone-methacrylic acid copolymer and acrylic acid-methylmethacrylate copolymer.

12. The printing plate material as claimed in claim 7 wherein said organic solvent is selected from the group consisting of acetone, methyl ethyl ketone, cyclohexanone, tetrahydrofuran, dioxane, methanol, ethanol, ethyl formate, methyl acetate, ethyl acetate, benzene, toluene, methylene chloride, ethylene chloride, tetrachloroethane, trichloroethane, chloroform, chlorobenzene, ethylene chlorohydrin, chlorosulfonic acid, nitromethane, dimethyl formamide, morpholine, formic acid, acetic acid, benzoic acid, salicyclic acid, salicyclic acid ester, monochloroacetic acid, dichloroacetic acid, trichloroacetic acid, trifluoroacetic acid, 2-nitropropanol, benzyl alcohol, benzaldehyde, acetonyl acetone, acetophenone, benzamide, benzonitrile, benzyl amine, methyl nicotinate, phenol, o-chlorophenol, cresol and other phenol derivatives.

13. The printing plate material as claimed in claim 7 wherein said silver halide is selected from the group consisting of silver chloride, silver bromide, silver iodide, silver chlorobromide, silver chloroiodide, silver bromoiodide and silver chlorobromoidide.

14. The printing plate material as claimed in claim 7 wherein said light-sensitive silver halide emulsion layer contains at least one member selected from the group consisting of sensitizers, sensitizing dyestuffs, anti-fogging agents, hardeners, surface active agents, and other additives.

15. A process for producing an offset printing plate comprising:
  (1) imagewise exposing a printing plate material comprising (a) a support having an oleophilic surface, (b) an intermediate layer consisting essentially of gelatin, nitrocellulose or mixtures thereof which is formed by coating a liquid consisting essentially of an organic solvent and gelatin, nitrocellulose or mixtures thereof on said oleophilic surface of said support and being removed said organic solvent, and (c) a hydrophilic diffusion transfer image-receiving layer containing nucleus substance for the physical development;
  (2) contacting the photosensitive silver halide emulsion layer of photosensitive material in which a imagewise latent image is formed previously with said hydrophilic diffusion transfer image-receiving layer of said printing plate material in the presence of a diffusion transfer developer for a negative silver image on said photosensitive silver halide emulsion layer and to form a positive silver image on said hydrophilic diffusion transfer image-receiving layer corresponding to non-image area of said photosensitive silver halide emulsion layer;

(3) separating said printing plate material from said photosensitive material;

(4) etching said silver image portion of said hydrophilic diffusion transfer image-receiving layer simultaneously together with etching the portion of said intermediate layer corresponding to said silver image area by treating with etching-bleach solution; and (5) remove said silver image area of said hydrophilic diffusion transfer image-receiving layer and said portion of said intermediate layer corresponding to said silver image area to uncover said oleophilic surface of said support corresponding to said silver image area.

16. The process claimed in claim 15, wherein said support having an oleophilic surface is selected from the group consisting of polyethylene terephthalate film, cellulose acetate film, synthetic paper, waterproofing paper and metal plates.

17. The process claimed in claim 15, wherein said intermediate layer has a 0.1 to $2\mu$ thickness.

18. The process claimed in claim 15, wherein said nucleus substance for physical development is selected from the group consisting of colloidal silver, silver sulfide, nickel sulfide, zinc sulfide, colloidal sulfur, thiosinamine, stannous chloride and chloroauric acid.

19. The process claimed in claim 15, wherein said hydrophilic diffusion transfer image-receiving layer is selected from the group consisting of gelatin, gum arabic, sodium alginate, methyl cellulose, carboxymethyl cellulose, hydroxymethyl cellulose, hydroxyethyl starch, hydroxypropyl starch, starch, polyvinylalcohol, polyvinylpyrrolidone, phenylpyrrolidone, vinylpyrrolidone-methacrylic acid copolymer and acrylic acid-methylmethacrylate copolymer.

20. The process claimed in claim 15, wherein said organic solvent is selected from the group consisting of acetone, methyl ethyl ketone, cyclohexanone, tetrahydrofuran, dioxane, methanol, ethanol, ethyl formate, methyl acetate, ethyl acetate, benzene, toluene, methylene chloride, ethylene chloride, tetrachloroethane, trichloroethane, chloroform, chlorobenzene, ethylene chlorohydrin, chlorosulfonic acid, nitromethane, dimethyl formamide, morpholine, formic acid, acetic acid, benzoic acid, salicyclic acid, salicyclic acid ester, monochloroacetic acid, dichloroacetic acid, trichloroacetic acid, trifluoroacetic acid, 2-nitropropanol, benzyl alcohol, benzaldehyde, acetonyl acetone, acetophenone, benzamide, benzonitrile, benzyl amine, methyl nicotinate, phenol, o-chlorophenol, cresol and other phenol derivatives.

21. A process for producing an offset printing plate comprising:

(1) imagewise exposing a printing plate material comprising (a) a support having an oleophilic surface, (b) an intermediate layer consisting essentially of gelatin, nitrocellulose or mixtures thereof which is formed by coating a liquid consisting essentially of an organic solvent and gelatin, nitrocellulose or mixtures thereof on said oleophilic surface of said support and being removed said organic solvent, (c) a hydrophilic diffusion transfer image-receiving layer containing nucleus substance for the physical development, and (d) a photosensitive silver halide emulsion layer;

(2) imagewise exposing said photosensitive silver halide emulsion layer to form imagewise latent image;

(3) subjecting said imagewise exposed printing plate material to diffusion transfer development to form a negative silver image on said photosensitive silver halide emulsion layer and to form a positive silver image on said hydrophilic diffusion transfer image-receiving layer corresponding to non-image area of said photosensitive silver halide emulsion layer;

(4) removing said photosensitive silver halide emulsion layer;

(5) etching said silver image portion of said hydrophilic diffusion transfer image-receiving layer simultaneously together with etching the portion of said intermediate layer corresponding to said silver image area by treating with etching-bleach solution; and (6) remove said silver image area of said hydrophilic diffusion transfer image-receiving layer and said portion of said intermediate layer corresponding to said silver image area to uncover said oleophilic surface of said support corresponding to said silver image area.

22. The process claimed in claim 21, wherein said support having an oleophilic surface is selected from the group consisting of polyethylene terephthalate film, cellulose acetate film, synthetic paper, waterproofing paper and metal plates.

23. The process claimed in claim 21, wherein said intermediate layer has a 0.1 to $2\mu$ thickness.

24. The process claimed in claim 21, wherein said nucleus substance for physical development is selected from the group consisting of colloidal silver, silver sulfide, nickel sulfide, zinc sulfide, colloidal sulfur, thiosinamine, stannous chloride and chloroauric acid.

25. The process claimed in claim 21, wherein said hydrophilic diffusion transfer image-receiving layer contains a member selected from the group consisting of gelatin, gum arabic, sodium alginate, methyl cellulose, carboxymethyl cellulose, hydroxymethyl cellulose, hydroxyethyl starch, hydroxypropyl starch, starch, polyvinylalcohol, polyvinylpyrrolidone, phenylpyrrolidone, vinylpyrrolidone-methacrylic acid copolymer and acrylic acid-methylmethacrylate copolymer.

26. The process claimed in claim 21, wherein said organic solvent is selected from the group consisting of acetone, methyl ethyl ketone, cyclohexanone, tetrahydrofuran, dioxane, methanol, ethanol, ethyl formate, methyl acetate, ethyl acetate, benzene, toluene, methylene chloride, ethylene chloride, tetrachloroethane, trichloroethane, chloroform, chlorobenzene, ethylene chlorohydrin, chlorosulfonic acid, nitromethane, dimethyl formamide, morpholine, formic acid, acetic acid, benzoic acid, salicyclic acid, salicyclic acid ester, monochloroacetic acid, dichloroacetic acid, trichloroacetic acid, trifluoroacetic acid, 2-nitropropanol, benzyl alcohol, benzaldehyde, acetonyl acetone, acetophenone, benzamide, benzonitrile, benzyl amine, methyl nicotinate, phenol, o-chlorophenol, cresol and other phenol derivatives.

27. The process claimed in claim 21, wherein said silver halide is selected from the group consisting of silver chloride, silver bromide, silver iodide, silver chlorobromide, silver chloroiodide, silver bromoiodide and silver chlorobromoiodide.

28. The process claimed in claim 21, wherein said photosensitive silver halide emulsion layer contains at least one member selected from the group consisting of sensitizers, sensitizing dyestuffs, anti-fogging agents, hardeners, surface active agents, and other additives.

* * * * *